United States Patent
Roy et al.

(10) Patent No.: US 9,552,977 B2
(45) Date of Patent: Jan. 24, 2017

(54) LANDSIDE STIFFENING CAPACITORS TO ENABLE ULTRATHIN AND OTHER LOW-Z PRODUCTS

(71) Applicant: Intel Corporation, Santa Clara, CA (US)

(72) Inventors: Mihir K Roy, Chandler, AZ (US); Mathew J Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 265 days.

(21) Appl. No.: 13/709,824

(22) Filed: Dec. 10, 2012

(65) Prior Publication Data

US 2014/0160675 A1 Jun. 12, 2014

(51) Int. Cl.
| | |
|---|---|
| *H01L 23/00* | (2006.01) |
| *H01L 21/02* | (2006.01) |
| *G06F 1/16* | (2006.01) |
| *H01L 23/50* | (2006.01) |
| *H01L 23/498* | (2006.01) |

(52) U.S. Cl.
CPC .............. *H01L 21/02* (2013.01); *G06F 1/1658* (2013.01); *H01L 23/49833* (2013.01); *H01L 23/50* (2013.01); *H01L 23/49816* (2013.01); *H01L 24/13* (2013.01); *H01L 24/16* (2013.01); *H01L 24/29* (2013.01); *H01L 2224/13101* (2013.01); *H01L 2224/16225* (2013.01); *H01L 2224/2919* (2013.01); *H01L 2224/83815* (2013.01); *H01L 2924/1461* (2013.01); *H01L 2924/19105* (2013.01); *H01L 2924/3511* (2013.01)

(58) Field of Classification Search
None
See application file for complete search history.

(56) References Cited

U.S. PATENT DOCUMENTS

| | | | | |
|---|---|---|---|---|
| 5,659,455 | A * | 8/1997 | Herbert | 361/306.1 |
| 6,014,318 | A * | 1/2000 | Takeda | 361/764 |
| 6,252,761 | B1* | 6/2001 | Branchevsky | 361/321.2 |
| 6,392,898 | B1* | 5/2002 | Asai et al. | 361/794 |
| 6,563,158 | B1* | 5/2003 | Houston et al. | 257/296 |
| 6,724,080 | B1* | 4/2004 | Ooi et al. | 257/704 |
| 6,775,150 | B1* | 8/2004 | Chakravorty et al. | 361/761 |
| 7,115,988 | B1* | 10/2006 | Hool | 257/713 |
| 7,173,329 | B2* | 2/2007 | Frutschy et al. | 257/698 |
| 7,196,907 | B2* | 3/2007 | Zheng | 361/760 |
| 7,259,106 | B2* | 8/2007 | Jain | 438/737 |
| 7,402,854 | B2* | 7/2008 | Bernstein et al. | 257/278 |
| 7,473,585 | B2* | 1/2009 | Brandenburg et al. | 438/124 |
| 7,635,641 | B2* | 12/2009 | Hurwitz et al. | 438/612 |
| 7,651,890 | B2* | 1/2010 | Goth et al. | 438/115 |
| 7,714,432 | B2* | 5/2010 | Tang | 257/701 |

(Continued)

*Primary Examiner* — Hoa C Nguyen
*Assistant Examiner* — Xanthia C Cunningham
(74) *Attorney, Agent, or Firm* — Schwegman Lundberg & Woessner, P.A.

(57) ABSTRACT

Embodiments of systems, devices, and methods to minimize warping of ultrathin IC packaged products are generally described herein. In some embodiments, an apparatus includes an IC mounted on a package substrate, and a capacitive stiffener subassembly mounted on the package substrate. The capacitive stiffener subassembly includes a plurality of capacitive elements electrically connected to contacts of the IC.

15 Claims, 3 Drawing Sheets

(56) References Cited

U.S. PATENT DOCUMENTS

| | | | |
|---|---|---|---|
| 7,884,470 B2* | 2/2011 | Cheah et al. | 257/724 |
| 8,089,149 B2* | 1/2012 | Hiraga | H01L 23/49531 |
| | | | 257/532 |
| 8,115,303 B2* | 2/2012 | Bezama et al. | 257/719 |
| 8,415,809 B2* | 4/2013 | Kang | 257/778 |
| 8,598,698 B1* | 12/2013 | Lim | 257/698 |
| 2003/0015787 A1* | 1/2003 | Geissinger et al. | 257/692 |
| 2005/0148121 A1* | 7/2005 | Yamazaki et al. | 438/149 |
| 2007/0158804 A1* | 7/2007 | Hosoya et al. | 257/684 |
| 2010/0117192 A1* | 5/2010 | Lee et al. | 257/532 |
| 2010/0290191 A1* | 11/2010 | Lin et al. | 361/704 |
| 2012/0120614 A1* | 5/2012 | Ueno | 361/748 |
| 2012/0146180 A1* | 6/2012 | Roy et al. | 257/531 |
| 2012/0223422 A1* | 9/2012 | Sun et al. | 257/664 |
| 2013/0107492 A1* | 5/2013 | Massolle | 361/811 |
| 2014/0070366 A1* | 3/2014 | Yen et al. | 257/532 |

\* cited by examiner

LANDSIDE STIFFENING CAPACITORS TO ENABLE ULTRATHIN AND OTHER LOW-Z PRODUCTS

TECHNICAL FIELD

Embodiments pertain to packaging of integrated circuits (ICs). Some embodiments relate to reducing warping of IC packages.

BACKGROUND

There is continued demand to increase functionality of integrated circuits (ICs) and to provide these increasingly complex ICs in smaller packages. However, manufacturing of electronic systems that use these ICs can include exposing packaged ICs to environmental stresses. For example, manufacturing of electronic systems may involve multiple thermal cycles in assembling a packaged IC and in incorporating the packaged IC into an electronic system assembly. Adverse effects of environmental stresses can become dominant in manufacturing problems as the thickness of the package of the IC is reduced. These adverse effects can include a packaged IC becoming misshapen which can render the packaged IC unusable. Thus, there are general needs for systems and methods that provide packaged integrated circuits that are more robust to environmental effects.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As explained previously herein, IC packages continue to decease in size and thickness. This has led to some surface-mount IC packages that are referred to as ultrathin or low-Z to refer to the small Z-dimension. Ultrathin packaging can refer to package heights of about 500 micrometers (µm) or less. One approach to forming an ultrathin package is coreless packaging. In conventional IC packaging, an IC is mounted on a core material such as a substrate. Additional layers are then built up on the core to distribute IC connections to package interconnect. In contrast, coreless packaging does not possess the core. Instead, only build up layers are used to create a coreless substrate. This reduces the height dimension of the substrate and the packaged IC.

The thinness of the substrate can result in a package that can be flexible. Manufacturing of the packaged IC can involve multiple thermal cycling steps. For instance, the substrate may be heated to add solder bumps (e.g., flip-chip or C4 solder bumps) to the substrate. The substrate may again be heated one or more times for die placement and solder reflow. Another cycle may be added if epoxy is used in the assembly process. Yet another thermal cycle may be used to incorporate the packaged IC into an electronic system assembly. These multiple thermal cycles can lead to warping of one or both of the substrate and the packaged IC.

Figure 1:
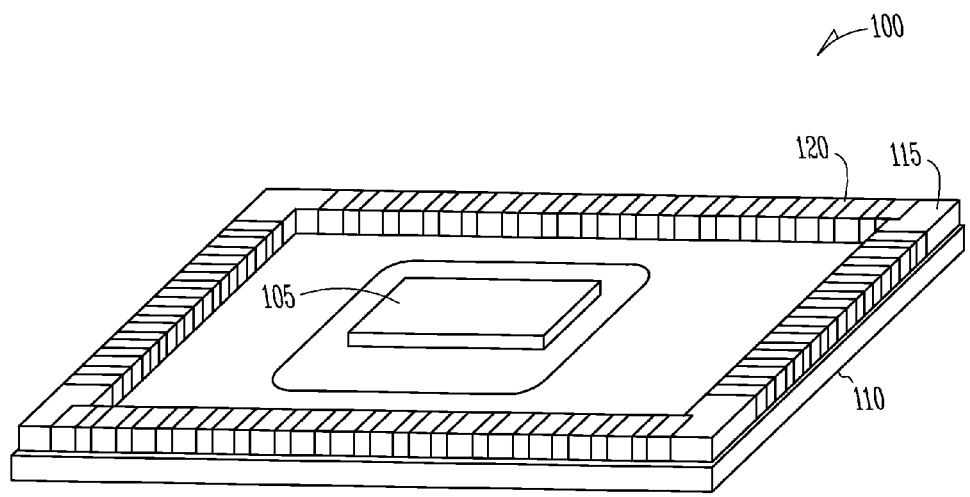
FIG. 1 is an illustration of portions of an example of a device to minimize warping of ultrathin IC packaged products.

FIG. 1 is an illustration of portions of an example of a device 100 to minimize warping of ultrathin IC packaged products. The device 100 includes an IC 105 mounted on a package substrate 110. In some examples, the device can include more than one IC mounted on the package substrate 110, such as a central processing unit (CPU) and one or more memory device ICs. The package substrate 110 can be an ultrathin package substrate or low-Z package substrate, such as a coreless package substrate for example. The device 100 also includes a capacitive stiffener subassembly 115.

The capacitive stiffener subassembly 115 includes a plurality of capacitive elements that are electrically connected to contacts of the IC 105. Attachment or mounting of the subassembly to the package substrate 110 makes the assembled package substrate more resistant to warping. A capacitive element 120 can be included in a filtering circuit electrically connected to a contact of the IC. Thus, the capacitive elements of the subassembly can replace any surface mount capacitors normally used for filtering noise.

The capacitive elements can be embedded in a material with insulating properties, such as a ceramic material or a polymer material for example. A non-insulating material such as stainless steel could be used to stiffen the substrate, but this may complicate including capacitive elements in the stiffener. For instance, the capacitive elements may need to be coated in electrically insulative material. Also, because the capacitive elements are included in the stiffener, the stiffener and capacitors are added in one step, rather than multiple steps of adding a stiffener (e.g., a monolithic steel stiffener) and placing and reflowing surface mount capacitors. This essentially reduces the number of thermal cycles to which the package is exposed during manufacturing.

In the example shown in FIG. 1, the capacitive stiffener subassembly 115 is arranged substantially around the perimeter of the package substrate 110 with the IC mounted in the middle of the capacitive stiffener subassembly 115. The capacitive stiffener subassembly 115 can be arranged slightly inward from the perimeter of the package substrate 110 and still provide support or stiffening to the package substrate 110. The example also shows a monolithic subassembly, but the capacitive stiffener subassembly 115 can include one or more gaps if desired. The IC package in the example shown can be used to package a processor, digital signal processor (DSP), application specific integrated circuit (ASIC), or SOC. The example of FIG. 1 also shows that one or more ICs can be mounted on a top side of the package substrate 110 and the capacitive stiffener subassembly 115 also mounted on the top side of the package substrate 110, but other arrangements can be used.

Figure 2:
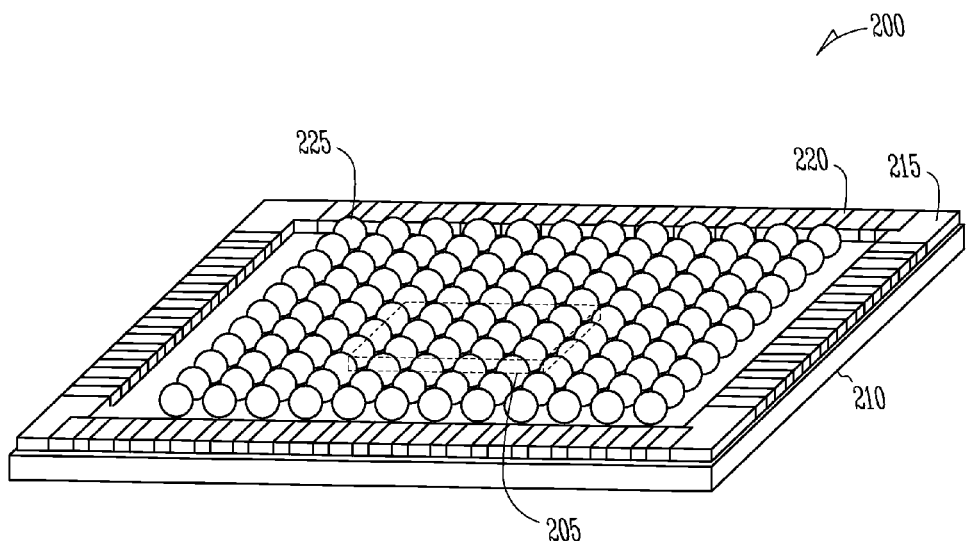
FIG. 2 is an illustration of portions of an example of another device to minimize warping of ultrathin IC packaged products.

FIG. 2 is an illustration of portions of an example of another device 200 to minimize warping of ultrathin IC packaged products. The device 200 includes an IC 205 mounted on the top side of a package substrate 210 and solder bumps 225 arranged on the bottom side of the device 200. The device 200 also includes a capacitive stiffener subassembly 215 mounted on the bottom side of the package substrate 210. The capacitive elements of the subassembly can be electrically connected to contacts of the IC through layers and vias included in the package substrate 210. The example in the Figure shows solder bumps formed on the bottom side that are ball grid array (BGA) electrical contacts, but the solder bumps can include at least one of BGA electrical contacts, land grid array electrical contacts, pin grid array electrical contacts, and the like. The height of the capacitive stiffener subassembly 215 is less than the height of the solder bumps to facilitate mounting of the device 200 to another assembly such as another substrate or printed circuit board (PCB).

Figure 3:
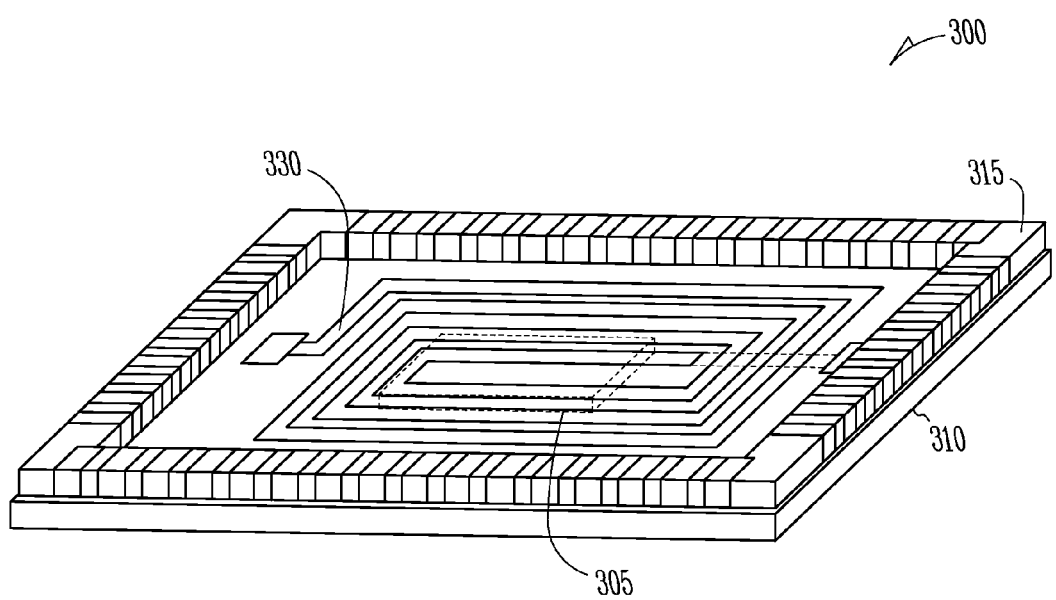
FIG. 3 is an illustration of portions of another example of an ultrathin electronics device.

FIG. 3 is an illustration of portions of another example of an ultrathin electronics device 300. The device 300 can include an IC 305 mounted on a first or top side of a package substrate 310 and an inductor 330 arranged on a second or bottom side of the package substrate. The traces or wires for the inductor 330 can be formed as a layer of the package substrate 310. In certain examples, the traces or wires can be formed on the package substrate as a suspended inductor using micro-electromechanical system (MEMS) methods. In a suspended inductor, the traces can be formed on a sacrificial layer above the plane of the package substrate. Removal of the sacrificial layer can leave the inductor suspended (e.g., in air) above the package substrate. A suspended inductor may have improved frequency response over a planar inductor.

Other layers of the package substrate 310 can provide interconnect to the IC. A capacitive stiffener subassembly 315 is mounted on the second side of the package substrate 310 with the inductor 330. The device 300 in the example can be a radio frequency integrated circuit (RFIC) formed in an ultrathin package. RFICs can be used in cellular telephones and in local area network devices or personal area network devices.

Because of the low height of the packaged IC in the examples of FIGS. 1-3, it can be advantageous to include the IC package in a low height electronic system such as a tablet computer for example. The electronic system can include a semiconductor subassembly mounted on a printed circuit board (PCB) (e.g., a motherboard). The semiconductor subassembly can include one or more ICs mounted to one or more ultrathin package substrates to form an ultrathin semiconductor subassembly. The semiconductor subassembly can include a capacitive stiffener subassembly mounted on the one or more ultrathin package substrates. In some examples, an ultrathin package substrate is a coreless substrate, and solder bumps such as BGA contacts are formed on the coreless substrate to form a coreless subassembly. If the capacitive stiffener subassembly is mounted on the same side of the package substrate as the BGA contacts, the BGA ball pitch will determine the coreless subassembly to PCB gap, and the height of the capacitive stiffener subassembly should be less than the BGA ball pitch.

Figure 4:
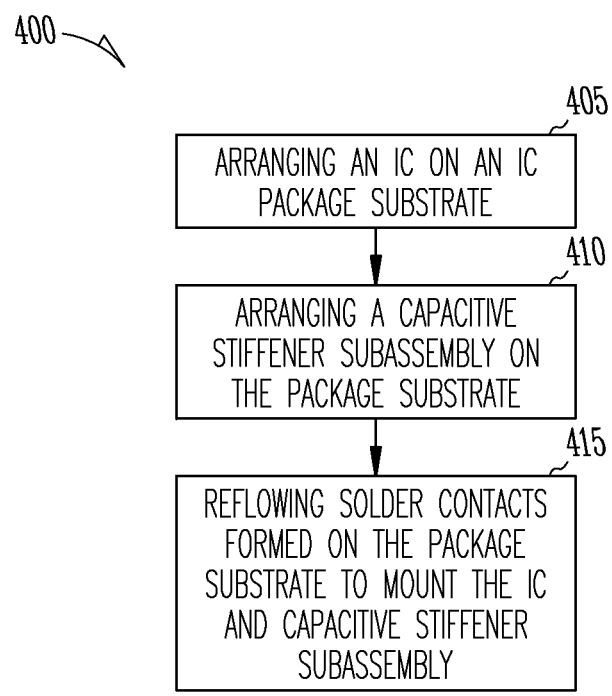
FIG. 4 shows a flow diagram of an example of a method of forming an ultrathin IC package.

FIG. 4 shows a flow diagram of an example of a method 400 of forming an ultrathin IC package. At block 405, an IC is arranged on a package substrate. In some examples, the package substrate is a coreless substrate. The package substrate may include solder bumps such as C4 solder bumps or die-side solder bumps. Flux may be sprayed onto the solder bumps before the IC is arranged on the package substrate.

At block 410, a capacitive stiffener subassembly is arranged on the package substrate. The capacitive stiffener subassembly can include any of the examples described previously herein. In some examples, the capacitive stiffener subassembly is arranged substantially around a perimeter of a first or top side of the package substrate and the IC is arranged in the middle of the capacitive substrate subassembly on the first side, such as shown in the example FIG. 1. In certain examples, multiple ICs arranged on the first side of package substrate.

In some examples, the package substrate includes solder contacts or solder bumps (e.g., BGA solder contacts) formed on the bottom side. The capacitive stiffener subassembly can be arranged on the bottom side. As shown in the example of FIG. 2, the capacitive stiffener subassembly can be arranged around the perimeter of the bottom side with the solder bumps substantially in the middle of the capacitive stiffener subassembly, and the IC can be arranged on the top side of the package substrate. The solder bumps can be formed in other patterns than the pattern shown in the example of FIG. 2.

When the IC and the capacitive stiffener subassembly are arranged (e.g., by a pick and place process), at block 415 the solder contacts formed on the package substrate can be reflowed to mount the IC and the capacitive stiffener subassembly on the package substrate. The packaged IC and substrate assembly may then undergo a deflux process. The packaged IC and substrate assembly may also undergo an underfilling process involving dispensing, flow, and cure of the underfill material. Because the capacitors are integral to the capacitive stiffener subassembly, separate steps to place die side surface mount capacitors and to place and epoxy a separate stiffener are not needed. Thus, the number of steps in an assembly process can be reduced by using the capacitive stiffener subassembly.

In some examples, the method 400 can include mounting a passive electronic component such as an inductor on the package substrate. The reflow process can include reflowing the package substrate to mount the inductor on a second side of the substrate such as shown in the example of FIG. 3. In certain examples, an underfilling process can be included in mounting the inductor to the package substrate. Other passive components such as resistors and capacitors can also be mounted the second side of the substrate. In certain examples, an active component, such as another IC, can be mounted on the second side of the substrate.

It can be seen from the systems, methods, and devices described herein that a capacitive stiffener will provide support for an ultrathin substrate to prevent warping and not compromise available real estate on the substrate.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment. Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

What is claimed is:

1. An apparatus comprising:
   an integrated circuit (IC) mounted on a first side of an IC package substrate;
   solder bumps arranged on a second side of the package substrate; and
   a capacitive stiffener subassembly mounted on the second side of the package substrate, wherein the capacitive stiffener subassembly includes a plurality of capacitors embedded in stiffening material, electrically connected to contacts of the IC, and arranged substantially around the perimeter of the IC package substrate, wherein the capacitors are alternated with regions of the stiffening material in a lateral direction along the perimeter, and wherein the solder bumps are arranged within the perimeter and extend above a height of the capacitive stiffener subassembly.

2. The apparatus of claim 1, wherein the IC package substrate is coreless.

3. The apparatus of claim 1, wherein the capacitive stiffener subassembly is monolithic and includes the plurality of capacitors embedded in a ceramic material.

4. The apparatus of claim 1, wherein the capacitive stiffener subassembly is monolithic and includes the plurality of capacitors embedded in a polymer material.

5. The apparatus of claim 1, wherein the solder bumps are included in at least one of ball grid array electrical contacts, land grid array electrical contacts, or pin grid array electrical contacts, and
   wherein the height of the capacitive stiffener subassembly is less than the height of the at least one of the ball grid array electrical contacts, land grip array electrical contacts, or pin grid array electrical contacts.

6. The apparatus of claim 1, wherein a capacitive element is included in a filtering circuit electrically connected to a contact of the IC.

7. The apparatus of claim 1, wherein the IC includes a central processing unit.

8. An apparatus comprising:
   an integrated circuit (IC) mounted on a first side of an IC package substrate, wherein the IC includes a radio frequency integrated circuit (RFIC);
   an electronic component mounted on a second side of the package substrate; and
   a capacitive stiffener subassembly mounted on the second side of the package substrate, wherein the capacitive stiffener includes a plurality of capacitors embedded in stiffening material, electrically connected to contacts of the IC, and arranged substantially around the perimeter of the IC package substrate, wherein the capacitors are alternated with regions of the stiffening material in a lateral direction along the perimeter, and wherein the electronic component is arranged within the perimeter.

9. The apparatus of claim 8, wherein the electronic component includes an inductor.

10. A method comprising:
    arranging an IC on a top side of an IC package substrate, wherein the package substrate includes at least one of ball grid array, land grid array, or pin grid array solder contacts on a bottom side of the package substrate;
    arranging a capacitive stiffener subassembly on a bottom side of the package substrate and substantially around the perimeter of the IC package substrate, wherein the capacitive stiffener includes a plurality of capacitors embedded in stiffening material, electrically connected to contacts of the IC, wherein the capacitors are alternated with regions of the stiffening material in a lateral direction along the perimeter, and wherein the at least one of ball grid array, land grid array, or pin grid array solder contacts are arranged within the perimeter and extend above a height of the capacitive stiffener subassembly; and
    reflowing solder contacts formed on the package substrate to mount the IC and capacitive stiffener subassembly on the package substrate.

11. The method of claim 10, wherein mounting the capacitive stiffener includes arranging the at least one of ball grid array, land grid array, or pin grid array solder contacts substantially in the middle of the capacitive stiffener subassembly.

12. The method of claim 10, including mounting a suspended inductor to the package substrate, and wherein reflowing the solder contacts includes reflowing the solder contacts to mount the suspended inductor to the package substrate.

13. A tablet computer comprising:
    a printed circuit board (PCB); and
    a semiconductor subassembly mounted on the PCB, wherein the semiconductor subassembly includes:
    a package substrate;
    at least one integrated circuits (IC) mounted on a first side of the package substrate;
    solder bumps arranged on a second side of the package substrate; and
    a capacitive stiffener subassembly mounted on the second side of the package substrate, wherein the capacitive stiffener subassembly includes a plurality of capacitors embedded in stiffening material, electrically connected to contacts of the IC, and arranged substantially around the perimeter of the IC package substrate, wherein the capacitors are alternated with regions of the stiffening material in a lateral direction along the perimeter, and wherein the solder bumps are arranged within the perimeter and extend above a height of the capacitive stiffener subassembly.

14. The tablet computer of claim 13, wherein the solder bumps are included in at least one of ball grid array electrical contacts, land grid array electrical contacts, or pin grid array electrical contacts, and
    wherein the height of the capacitive stiffener subassembly is less than the height of the at least one of the ball grid array electrical contacts, land grip array electrical contacts, or pin grid array electrical contacts.

15. The tablet computer of claim 13, wherein the package substrate includes a coreless substrate and ball grid array solder contacts on a bottom side of the package substrate to form a coreless subassembly, wherein the at least one IC is mounted on a top side of the coreless subassembly, and wherein the capacitive stiffener subassembly is mounted on the bottom side of the coreless subassembly.

* * * * *